United States Patent [19]

Saito et al.

[11] Patent Number: 5,659,774

[45] Date of Patent: Aug. 19, 1997

[54] COMPUTER-AIDED DESIGN APPARATUS INCLUDING A THREE-DIMENSIONAL PHYSICAL QUANTITY CALCULATING SYSTEM

[75] Inventors: Katsu Saito, Saitama; Tetsuzo Kuragano, Tokyo, both of Japan

[73] Assignee: Sony Corporation, Japan

[21] Appl. No.: 907,302

[22] Filed: Jul. 1, 1992

[30] Foreign Application Priority Data

Jul. 12, 1991 [JP] Japan .................................. 3-198595

[51] Int. Cl.$^6$ ............................................. G06F 17/50
[52] U.S. Cl. ........................ 395/117; 395/339; 395/964; 364/578
[58] Field of Search ............................ 364/578, 564, 364/369; 395/800, 155, 964, 119, 120, 339, 355, 500

[56] References Cited

U.S. PATENT DOCUMENTS 4,797,842  1/1989  Nackman et al. .................... 364/578
4,855,939  8/1989  Fitzgerald, Jr. et al. ............. 395/119
4,933,889  6/1990  Meshkat et al. ..................... 364/578
4,969,116  11/1990 Wada et al. .......................... 364/578
5,388,199  2/1995  Kakazu et al. ....................... 395/357

OTHER PUBLICATIONS

"Working Out with CAD", *Computer Graphics World*, vol. 12 n 9.

*Primary Examiner*—Parshotam S. Lall
*Assistant Examiner*—Viet Vu
*Attorney, Agent, or Firm*—Limbach & Limbach L.L.P.

[57] ABSTRACT

A three-dimensional physical quantity calculating system calculates the physical quantities of the whole cubic body composed of a plurality of elementary cubic bodies. The system includes a table calculating section for calculating the physical quantities of the whole cubic body on the basis of physical parameters inputted through an input section. The physical quantities of the respective elementary cubic bodies are calculated by an elementary cubic body physical quantity calculating section in accordance with predetermined calculation formula.

4 Claims, 3 Drawing Sheets

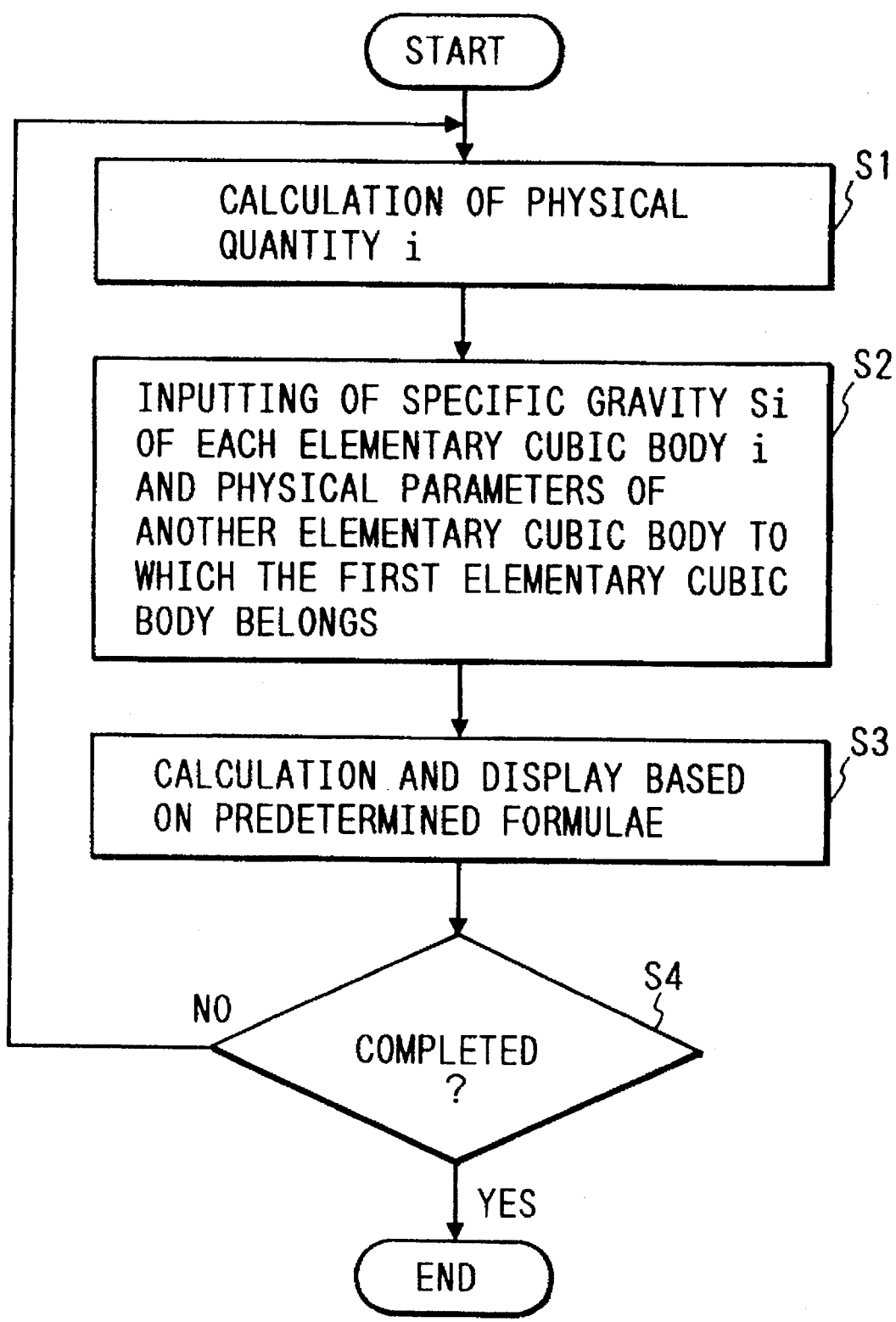

COMPUTER-AIDED DESIGN APPARATUS INCLUDING A THREE-DIMENSIONAL PHYSICAL QUANTITY CALCULATING SYSTEM

BACKGROUND OF THE INVENTION

1. Field of the Invention

The present invention relates to a three-dimensional physical quantity calculating system for calculating the physical quantity of a cubic body.

2. Description of the Prior Art

Conventionally, there has existed a three-dimensional physical quantity calculating system for calculating physical quantities such as cubic volume, mass, gravity center, etc. of a cubic body formed of only a homogeneous material and therefore having a uniform specific gravity.

The above-mentioned conventional three-dimensional physical quantity calculating system has been able to calculate the physical quantities of a cubic body only when the specific gravity of the cubic body is uniform in its entireties but it has been unable to calculate the mass of the cubic body where the cubic body (hereinafter referred to as the "whole cubic body") is composed of a plurality of subcubic bodies (hereinafter referred to as the "elementary cubic bodies"), and the specific gravities of the elementary cubic bodies are different from one another. Accordingly, the mass of the whole cubic body has been calculated on the basis of the actual model or prototype through measurements and manual calculations.

SUMMARY OF THE INVENTION

The present invention has been made in view of the above situation and, it is an object of the present invention to provide a computer-aided design apparatus which includes three dimensional physical quantity calculating system which is capable of calculating the physical quantities of the whole cubic body composed of a plurality of elementary cubic bodies.

To achieve the above-mentioned object, the three-dimensional physical quantity calculating system according to the present invention comprises: input means for inputting physical parameters (e.g. the specific gravities of the elementary cubic bodies, parameters showing interrelationship among the elementary cubic bodies and etc.); calculating means for calculating the physical quantities of the elementary cubic bodies; and table calculating means for calculating the physical quantities of the whole cubic body by introducing the physical parameters of the elementary cubic bodies inputted by the input means and the physical quantities of the respective elementary cubic bodies calculated by the calculating means, into predetermined calculation formulae.

In the case of the above-mentioned three-dimensional case of the physical quantity calculating system of the above-described structure, the table calculating means calculates the physical quantities of the whole cubic body by introducing the physical parameters inputted through the inputting means and the physical quantities of the respective elementary cubic bodies calculated by the elementary cubic body physical quantity calculating means into the predetermined calculation formulae and therefore, it is possible to make the calculation even when the physical parameters such as specific gravities and the like of some elementary cubic bodies are different from one another. A synthesizing section synthesizes data in order to display on a display unit an image representative of a three-dimensional view of whole cubic bodies and/or elementary cubic bodies.

BRIEF DESCRIPTION OF THE DRAWINGS

FIG. 3 is a flowchart showing an operation of the embodiment shown in FIG. 1.

DETAILED DESCRIPTION OF THE PREFERRED EMBODIMENT

One embodiment of the three-dimensional physical quantity calculating system according to the present invention will be described hereinbelow with reference to the attached drawings.

Figure 1:
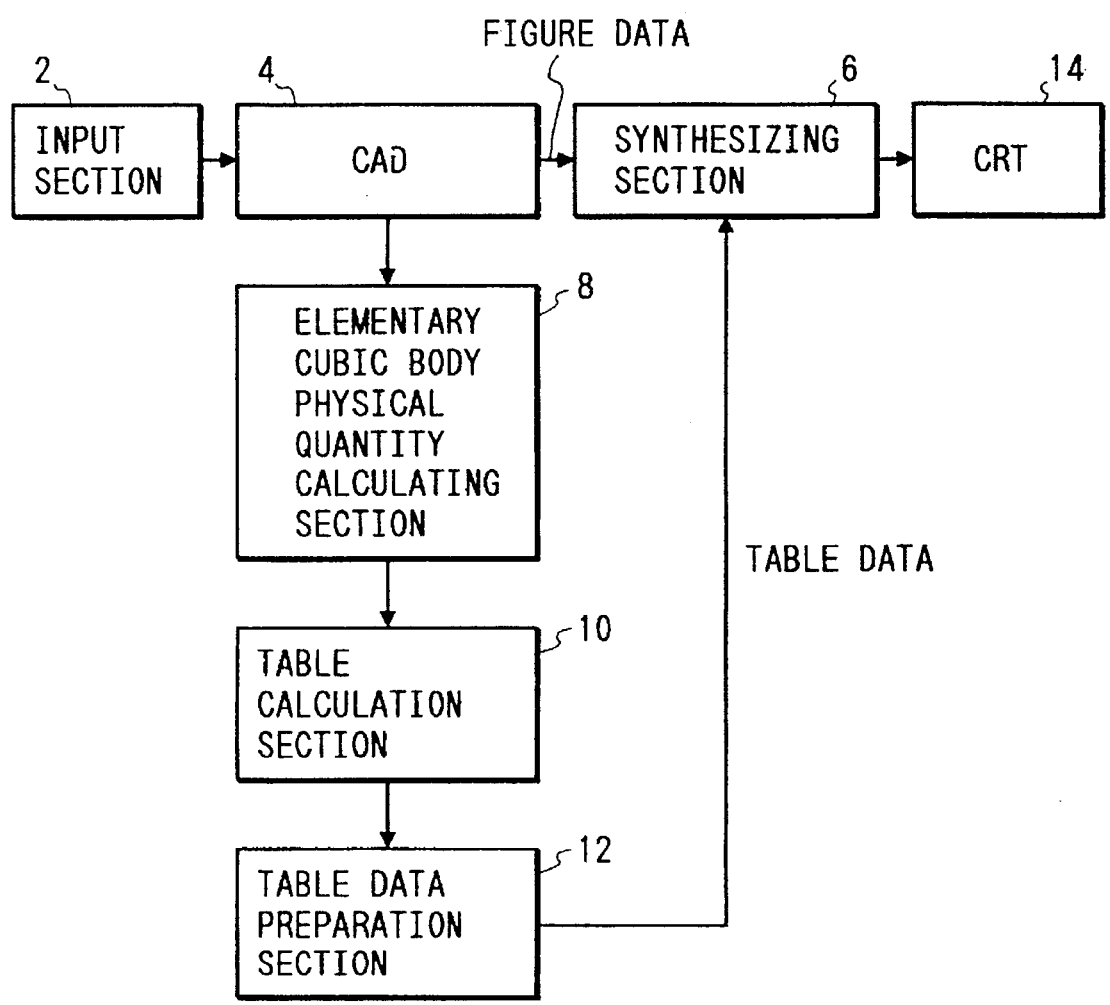
FIG. 1 is a block diagram of one embodiment of a three-dimensional physical quantity calculating system according to the present invention.

In FIG. 1, the three-dimensional physical quantity calculating system comprises an input section 2, a CAD (computer-aided design) apparatus 4, a synthesizing section, an elementary cubic body physical quantity calculating section 8, a table calculating section 10, a table data preparation section 12 and a CRT (cathode ray tube, or display unit) 14. The input section 2 is composed of a keyboard and a pointing device. The operator can input various physical parameters such as the kind, dimensions, and position of a cubic figure required to be displayed, the specific gravities of elementary cubic bodies forming the cubic figure, and the "interrelationship" (or belongingness) among the elementary cubic bodies, and etc., through the keyboard, and additionally the coordinates of the cubic figure through the pointing device.

Figure 2:
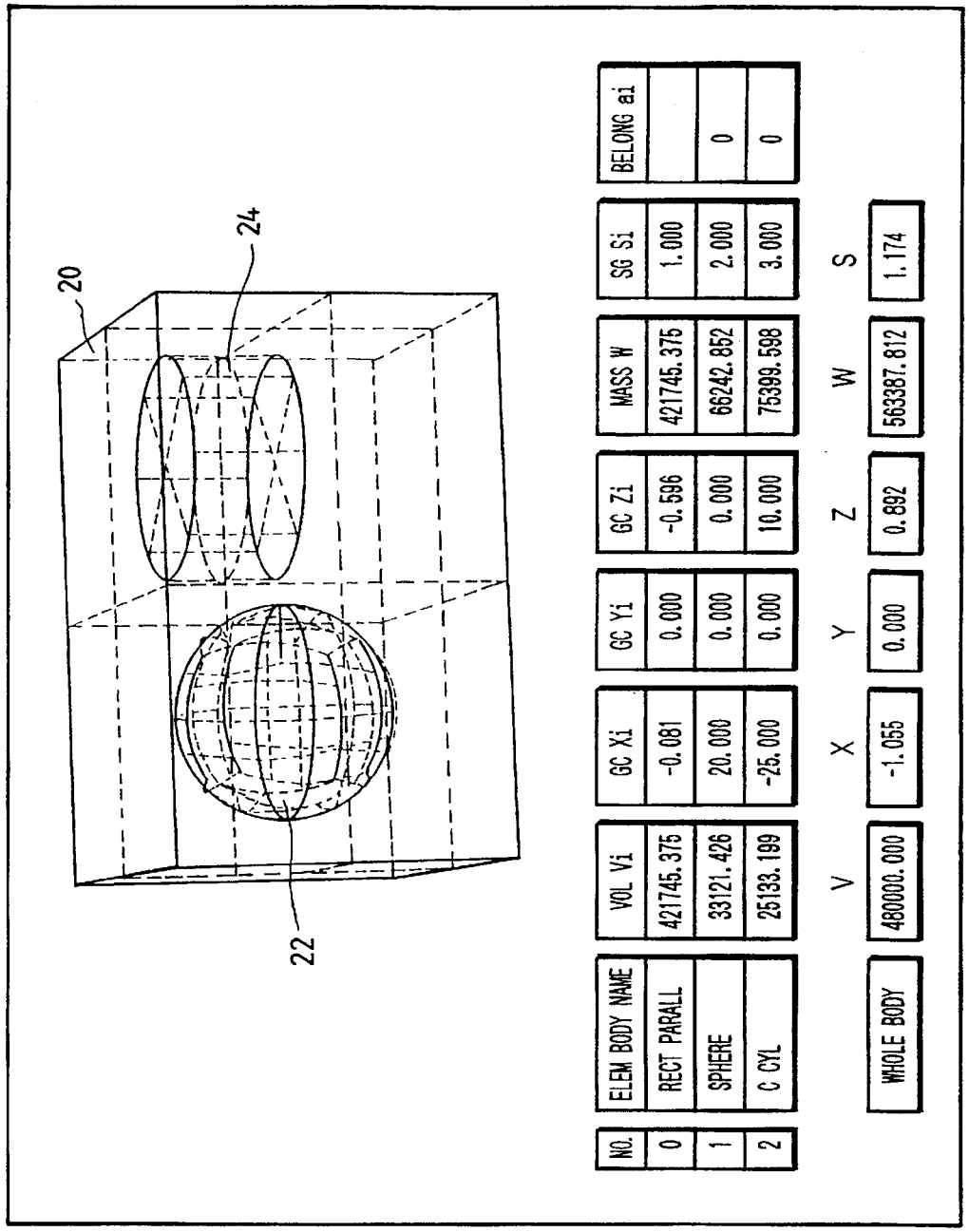
FIG. 2 is a pictorial view showing an example of a picture displayed on a display unit 4 shown in FIG. 1.

The "interrelationship" among the elementary cubic bodies will be described hereinbelow in further detail on the basis of a practical example. FIG. 2 shows an example of a picture displayed on the display unit 14. In FIG. 2, there are shown a sphere 22 and a circular cylinder 24 within a rectangular parallelepiped 20. In this case, it may be said that both of the elementary cubic bodies of the sphere 22 and the circular cylinder 24 "belong to" the rectangular parallelepiped 20 as an elementary cubic body. As shown on the lower leftmost side of FIG. 2, the rectangular parallel piped 20, the sphere 22 and the circular cylinder 24 are assigned with reference numerals 0, 1, and 2, respectively. Further, the number of the elementary cubic bodies to which the other elementary cubic bodies belong is shown in the column named as "Belong ai." In this example, since the sphere 22 and the circular cylinder 24 as elementary cubic bodies belong to the rectangular parallelepiped 20 as an elementary cubic body, the numeral "0" which designates the parallelepined, is displayed in the columns ai for the sphere 22 and the circular cylinder 24 on the lower rightmost side of FIG. 2.

The CAD system 4 prepares figure data by receiving output signals from the input section 2 and outputs the data to the synthesizing section 6. Further, it supplies the physical parameters of the elementary cubic bodies to the table calculating section 10 through the elementary cubic body physical quantity calculating section 8. The calculating section 8 calculates the physical quantities of the elementary cubic bodies such as cubic volumes, centers of gravity, masses and etc., of the rectangular parallelepiped 20, the sphere 20 and the circular cylinder 24 in the case of the example shown in FIG. 2. As to the above-mentioned elementary cubic body physical quantity calculating section 8, no further description is made herein since it is disclosed in detail in Japanese Patent Application No. 3-58153.

The table calculating section 10 receives the physical parameters of the elementary cubic bodies supplied from the input section 2 and the physical quantities of the elementary cubic bodies from the calculating section 8. When the whole cubic body is composed of n-numbered elementary cubic bodies, the table calculating section 10 defines various physical items of the respective elementary cubic bodies such as:

Vi: Volume (excluding the volumes of elementary cubic bodies i existing therewithin)

xi, yi zi: Centers of gravity (excluding the centers of gravity of the elementary cubic bodies existing therewithin)

Wi: Mass

Si: Specific gravity ai: =j if the elementary cubic bodies i belong to the another elementary cubic body j or =i if other than the above by the following formulae (1), (2) and (3):

$$Vi = Vi' - \sum_{j=1, j \neq i}^{n} (Vj \otimes f(j)) \quad (1)$$

where is i=aj, then f(j)=1, otherwise f(j)=0

$V_i'$ denotes the sum of the volume, excluding the volumes of elementary cubic bodies i existing therewithin and the sum j=1 to n=n, where j is not equal to 1, of the product of f(j) and the volumetric value excluding the elementary cubic bodies i exiting therewithin). (Vj' denotes the volumetric value excluding the elementary cubic bodies i existing therewithin)

$$xi = xi' \times Vi' - \sum_{j=1, j \neq i}^{k} (Vj \times f(x) \times xj')/Vi \quad (2)$$

(xi' denotes the gravity center value excluding the elementary cubic bodies i existing therewithin) (yi and zi are both the same as above)

$$Wi = Vi \times Si \quad (3)$$

Further, in the example shown in FIG. 2, Vj' of the formula (1)=(parallel piped volume); and Vj of the formula (1)=(parallel piped volume)−(cylinder volume)−(sphere volume)

Further, the table calculating section 10 calculates the volume V, the gravity centers X, Y, and Z, the mass W, and the specific gravity S of the whole cubic body in accordance with the following formulae:

$$V = \sum_{j=1}^{n} Vj \quad (4)$$

$$X = \sum_{j=1}^{n} xjVj/V \quad (5)$$

(Y, and Z are both the same as above)

$$W = \sum_{j=1}^{k} Wj \quad (6)$$

$$S = W/V \quad (7)$$

The table data preparation section 12 prepares table data on the basis of Vi, xi, yi, zi, wi, Si, and ai for the respective elementary cubic bodies and V, X, Y, Z, W, and S for the whole cubic body, all outputted by the table calculating section 10, and gives the prepared table data to the synthesizing section 6. The synthesizing section 6 synthesizes the figure data from the CAD apparatus 4 and the table data from the table data preparation section 12 to display a picture on the display unit 14 (e.g. CRT) as shown in FIG. 2.

FIG. 3 is a flowchart illustrating the operation of the three-dimensional physical quantity calculating system configured as shown in FIG. 1. First, in step S1, the elementary cubic body physical quantity calculating section 8 calculates the physical quantities such as the volume, center of gravity, mass and etc., of each elementary cubic body i such as the rectangular parallelepiped 20, sphere 22 or circular cylinder 24. The above-mentioned operation is disclosed in Japanese Patent Application No. 3-58183 as already mentioned.

Subsequently, in step S2, the user may input through the input section 2 various physical parameters such as the specific gravity Si of each elementary cubic body and its mutual relationship with another elementary cubic body. In the case of the example shown in FIG. 2, the user may input the specific gravities of 1,000, 2,000 and 3,000 of the rectangular parallelepiped 20, the sphere 22, and the circular cylinder 24, respectively, and also the number 0 of the rectangular parallelepiped 20 to which the sphere 22 and the circular cylinder 24 belong.

Further, in step S3, the table calculating section 10 calculates Vi, xi, yi, zi, and wi of the respective elementary cubic bodies and V, X, Y, Z, W, and S of the whole cubic body in accordance with the formulae (1) to (6). Subsequently, the table data preparation section 12 prepares table data on the basis of Vi, xi, yi, zi, wi, Si, and ai of the respective elementary cubic bodies and V, X, Y, Z, W, and S of the whole cubic body all outputted from the table calculating section 10. The prepared table data are outputted to the synthesizing section 6. The synthesizing section 6 synthesizes the figure data from the CAD apparatus 4 and the table data from the table data forming preparation 12, to display the picture on the display unit 14 as shown in FIG. 2. In step S4, when the user depresses an end key, the processing ends.

In the above embodiment, the table calculating section 10 not only calculates the volume, center of gravity and the mass of the whole cubic body but also displays on the display unit 14 all the figures of the whole cubic body including the respective elementary cubic bodies such as the rectangular parallelelpiped 20, the sphere 22 and the circular cylinder together with the volumes, centers of gravity and masses of the respective elementary cubic bodies and also the whole cubic body. Therefore, when the design is so modified as to delete an elementary cubic body, for instance, it is possible to display all the changes in the volume, center of gravity, and mass of the whole cubic body due to such deletion, in addition to the display of the whole cubic body from which the elementary cubic body is delected. Therefore, the user can modify the design while ascertaining whether or not the displayed changes conform to the characteristics required of the whole cubic body (e.g. a golf club).

As described above, in the case of the three-dimensional physical quantity calculating system according to the present invention, since there is provided the table calculating means for calculating the physical quantities of the whole cubic body on the bases of the physical parameters inputted through the inputting means and the physical quantities of the respective elementary cubic bodies calculated by the elementary cubic body physical quantity calculating means in accordance with the predetermined calculation formulae, it is possible to obtain the physical quantities such as volume, mass, and gravity center of the whole cubic body, even when the physical parameters such as specific gravities of the elementary cubic bodies are different from one another. Accordingly, it is possible to eliminate the need of manufacturing a practical prototype or model and of conducting manual calculation procedures. Therefore, the three-dimensional physical quantity calculating system of the present invention is effective in the design and analysis of golf clubs made of various metals, woods and etc., including spaces therein, or electric appliances made of various synthetic resins, metals and etc., including spaces therein.

What is claimed is:

1. A system for calculating physical quantities of a whole cubic body composed of a plurality of elementary cubic bodies and for generating images representative of three-dimensional views of the whole cubic bodies and/or the elementary cubic bodies, comprising:

input means for inputting physical parameters of the elementary cubic bodies, where at least a portion of respective specific gravities of the elementary cubic bodies are different from one another;

calculating means for calculating physical quantities of the elementary cubic bodies;

table calculating means for calculating at least one of mass, specific gravity and center of gravity of the whole cubic body on the basis of the physical parameters inputted through said input means and physical quantities of the respective elementary cubic bodies calculated by said calculating means in accordance with predetermined calculation formulae; and means for generating at least one image representative of a three-dimensional view of at least one from among the whole cubic body and the elementary cubic bodies and for further generating, adjacent to the image representative of a three-dimensional view, images of the calculated numeric physical quantities for each body displayed within the image representative of a three-dimensional view.

2. The system of claim 1, wherein the means for generating at least one image comprises:

synthesizing means operative to combine the inputted physical parameters of the elementary cubic bodies with the calculated physical quantities to produce signals representative of the image; and a cathode ray tube coupled to the synthesizing means operative to form the image from the signals.

3. A method for calculating physical quantities of a whole cubic body composed of a plurality of elementary cubic bodies and for generating images representative of three-dimensional views of the whole cubic bodies and/or the elementary cubic bodies, comprising the steps of:

inputting physical parameters of the elementary cubic bodies, where at least a portion of respective specific gravities of the elementary cubic bodies are different from one another;

calculating physical quantities of the elementary cubic bodies;

calculating at least one of mass, specific gravity and center of gravity of the whole cubic body on the basis of the inputted physical parameters means and physical quantities of the respective elementary cubic bodies calculated in accordance with predetermined calculation formulae; and generating at least one image representative of a three-dimensional view of at least one from among the whole cubic body and the elementary cubic bodies and further generating, adjacent to the image representative of a three-dimensional view, images of the calculated numeric physical quantities for each body displayed within the image representative of a three-dimensional view.

4. The method of claim 3, wherein step of generating at least one image comprises the steps of:

combining the inputted physical parameters of the elementary cubic bodies with the calculated physical quantities to produce signals representative of the image; and forming an image on a cathode ray tube based upon the signals representative of the image.

* * * * *